United States Patent
Fujiu et al.

(10) Patent No.: US 7,180,815 B2
(45) Date of Patent: *Feb. 20, 2007

(54) SEMICONDUCTOR INTEGRATED CIRCUIT DEVICE

(75) Inventors: Masaki Fujiu, Yokohama (JP); Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/389,048

(22) Filed: Mar. 27, 2006

(65) Prior Publication Data

US 2006/0176088 A1  Aug. 10, 2006

Related U.S. Application Data

(63) Continuation of application No. 10/935,581, filed on Sep. 8, 2004, now Pat. No. 7,042,787.

(30) Foreign Application Priority Data

Sep. 29, 2003  (JP) .............................. 2003-337549

(51) Int. Cl.
G11C 5/14 (2006.01)
(52) U.S. Cl. ...................... 365/226; 365/227
(58) Field of Classification Search ................ 365/226, 365/227, 185.01; 327/143
See application file for complete search history.

(56) References Cited

U.S. PATENT DOCUMENTS

| | | | |
|---|---|---|---|
| 5,278,792 A | 1/1994 | Inoue et al. | |
| 5,814,995 A | 9/1998 | Tasdighi | |
| 5,894,446 A | 4/1999 | Itou | |
| 5,929,672 A * | 7/1999 | Mitani | ......................... 327/143 |
| 6,204,703 B1 | 3/2001 | Kwon | |
| 6,320,428 B1 * | 11/2001 | Atsumi et al. | ................. 327/78 |
| 6,882,570 B2 | 4/2005 | Byeon et al. | |
| 2003/0095437 A1 | 5/2003 | Imamiya | |

FOREIGN PATENT DOCUMENTS

JP     2003-162453     6/2003

* cited by examiner

Primary Examiner—Anh Phung
(74) Attorney, Agent, or Firm—Oblon, Spivak, McClelland, Maier & Neustadt, P.C.

(57) ABSTRACT

A semiconductor integrated circuit device with a power-on detecting circuit, wherein the power-on detecting circuit includes: first and second power supply terminals between which an external power supply voltage is to be supplied; a first diode circuit having a first resistor and a first diode connected in series between the first and second power supply terminals, an interconnect node between the first resistor and first diode serving as a first voltage detecting node; a second diode circuit having second and third resistors and a second diode connected in series between the first and second power supply terminals, the second diode having a current drivability larger than the first diode, an interconnect node between the second and third resistors serving as a second voltage detecting node; and a first comparator for detecting a voltage of the second voltage detecting node becoming higher than that of the first voltage detecting node to output a power-on signal.

20 Claims, 9 Drawing Sheets

SEMICONDUCTOR INTEGRATED CIRCUIT DEVICE

CROSS-REFERENCE TO RELATED APPLICATION

This application is a Continuation of U.S. patent application Ser. No. 10/935,581, filed on Sep. 8, 2004, now U.S. Pat. No. 7,042,787, issued May 9, 2006, and is based on and claims the benefit of priority from the prior Japanese Patent Application No. 2003-337549, filed on Sep. 29, 2003. The entire contents of these applications are incorporated herein by reference.

BACKGROUND OF THE INVENTION

1. Field of the Invention

This invention relates to a semiconductor integrated circuit device having a power-on detecting circuit.

2. Description of Related Art

Many types of electrically rewritable and non-volatile memories (EEPROM) are known. A NAND-type flash memory is one of such EEPROMs. Usually, a flash memory has a power-on reset circuit therein for automatically initializing the internal circuit in response to power-on. There has already been provided a memory technique that initial setup data storage area is set in a memory cell array. There has also been provided a flash memory in which system start-up data (i.e., system boot data) storage area is set in a memory cell array, and the boot data is automatically read out by detecting power-on. For example, refer to Japanese Patent Application Laid Open (kokai) 2003-162453).

Power-on detecting circuits employed in the conventional flash memories are usually configured to detect that a voltage generated by resistance-dividing the external power supply voltage has become higher than a predetermined level, thereby outputting a power-on signal. In response to this power-on signal, an internal power circuit is activated, and above-described initial setup operations and boot data reading are performed.

It is required of the power-on detecting circuit equipped in the flash memory to be responsible to various external power supply voltages with different rising properties and different voltage levels. Unfortunately, every conventional power-on detecting circuit utilized in general outputs a power-on signal output timing of which is varied in correspondence with rising characteristics and voltage levels of the external power supply voltages. For example, in case the external power supply voltage has an abrupt rising property, a power-on signal will be output at an early timing after power-on. This fact causes the internal power supply circuit, which is activated by the power-on signal, to be impossible to output a stable internal power supply voltage. If the internal power supply voltage is not stabilized, the power-on reset operation will be harmfully influenced. In detail, starting a boot data read operation before the internal power supply voltage has been stabilized, the operation becomes erroneous.

SUMMARY OF THE INVENTION

According to one aspect of the present invention, there is provided a semiconductor integrated circuit device with a power-on detecting circuit, wherein the power-on detecting circuit includes:

first and second power supply terminals between which an external power supply voltage is to be supplied;

a first diode circuit having a first resistor and a first diode connected in series between the first and second power supply terminals, an interconnect node between the first resistor and first diode serving as a first voltage detecting node;

a second diode circuit having second and third resistors and a second diode connected in series between the first and second power supply terminals, the second diode having a current drivability larger than the first diode, an interconnect node between the second and third resistors serving as a second voltage detecting node; and a first comparator for detecting a voltage of the second voltage detecting node becoming higher than that of the first voltage detecting node to output a power-on signal.

DETAILED DESCRIPTION OF THE EMBODIMENTS

Illustrative embodiments of this invention will be explained with reference to the accompanying drawings below.

Figure 1:
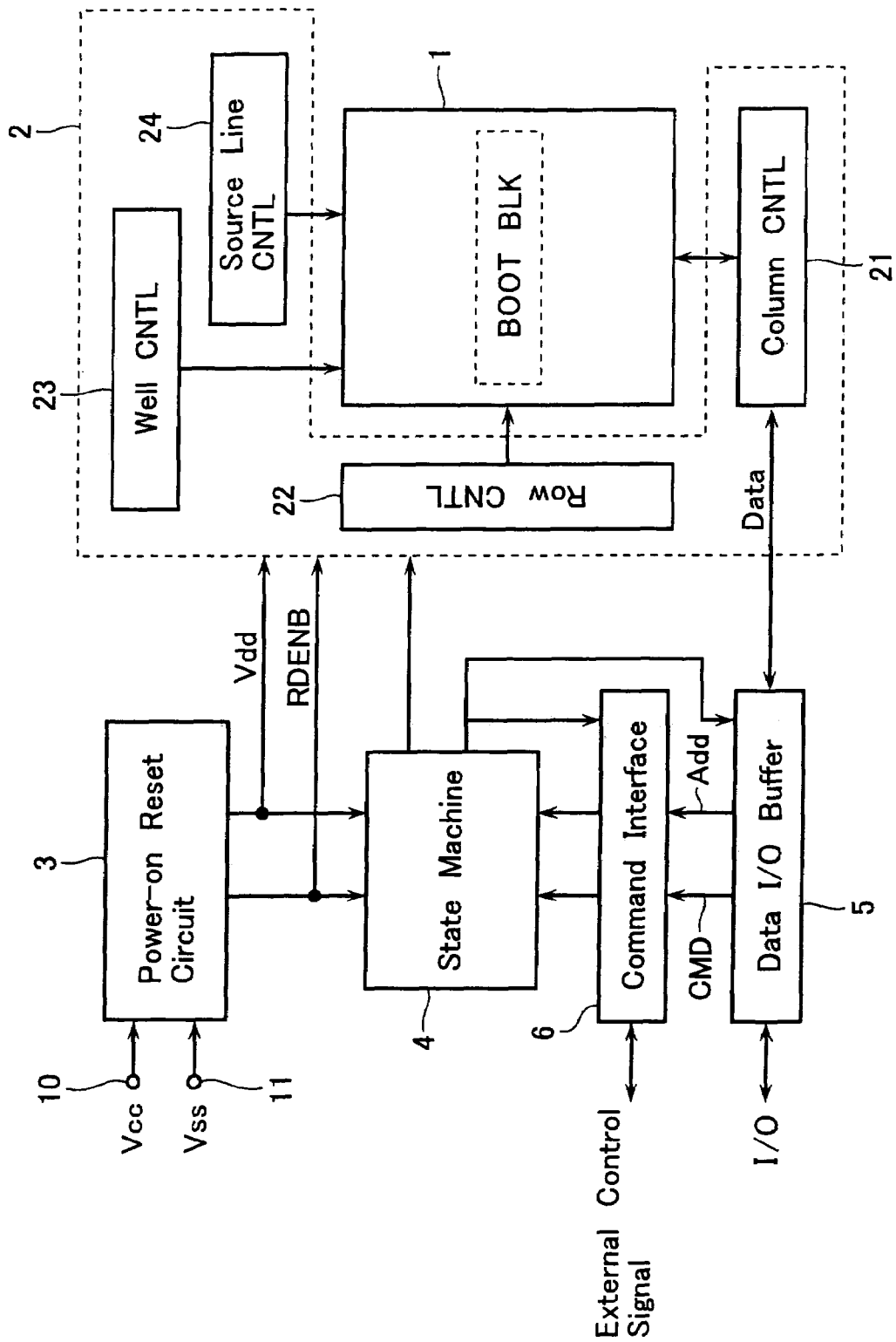
FIG. 1 shows a functional configuration of a flash memory in accordance with an embodiment of the present invention.

FIG. 1 shows a functional block of a NAND-type flash memory in accordance with an embodiment. A memory cell array 1 is, as described later, formed of electrically rewritable and non-volatile memory cells arranged therein. A read/write circuit 2 has column control circuit 21, row control circuit 22, well control circuit 23 and source line control circuit 24 for reading and writing the memory cell array 1.

The column control circuit 21 has a sense amplifier circuit (i.e., page buffer) for sensing cell data and storing write data, and column gates for selecting bit lines. The row control circuit 22 has a row decoder for selecting a word line and a word line driver for applying necessary voltages to selected and non-selected word lines. The well control circuit 23 is a driver circuit for applying a certain voltage to a p-type well in the semiconductor substrate on which the memory cell array is formed. The source line control circuit 24 is a driver circuit for applying a certain voltage to a common source line of the memory cell array.

Although having omitted in FIG. 1, a high-voltage generating circuit is prepared for generating various voltages used in read, write and erase operations.

Figure 2:
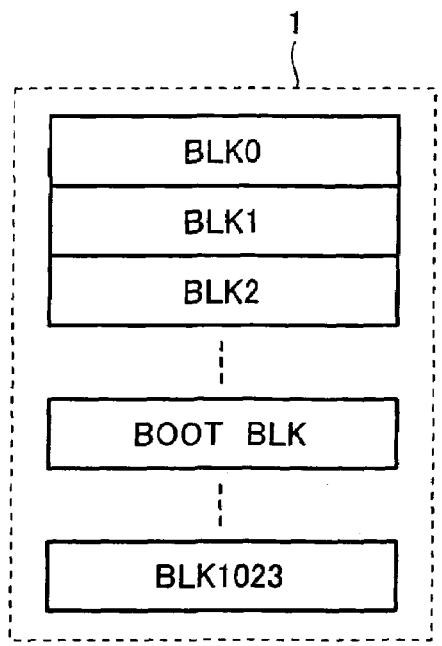
FIG. 2 shows a block configuration of a memory cell array of the flash memory.
Figure 3:
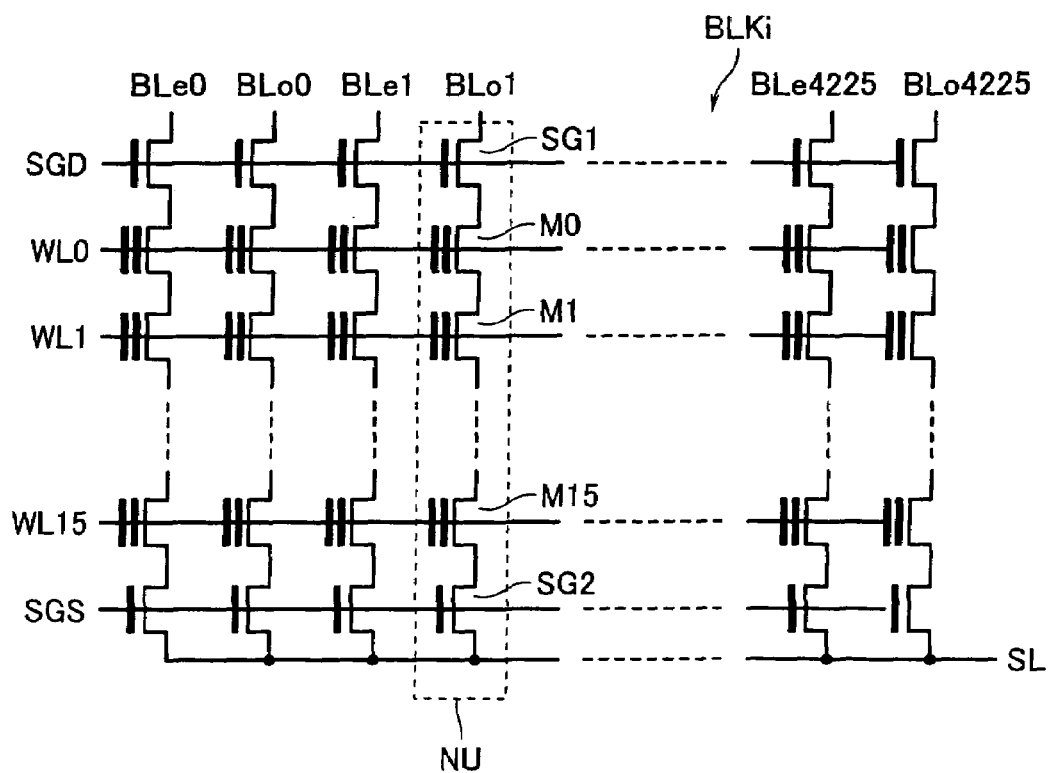
FIG. 3 shows the memory cell array arrangement.

FIG. 2 indicates that memory cell array 1 is formed of plurality of blocks BLKi (i=0, 1, . . . , 1023). FIG. 3 shows a detailed configuration of a block BLKi. Plural floating-gate type memory cells M0–M15 are connected in series to constitute a NAND cell unit NU. One end of NAND cell unit NU is connected to a bit line BL via a select gate transistor SG1, and the other end to a source line SL via a select gate transistor SG2. Control gates of the memory cells M(M0–M15) are coupled to different word lines WL(WL0–WL15), respectively. Gates of the select gate transistors SG1 and SG2 are connected to select gate lines SGD and SGS disposed in parallel with the word lines WL.

In the example shown in FIG. 3, NAND cell units arranged in the direction of the word lines are alternately coupled to even-numbered bit lies BLej (j=0, 1, . . . , 4225) and odd-numbered bit lines BLoj. A group of memory cells selected by the entire even-numbered bit lines BLej or the entire odd-numbered bit lies BLoj and a word line is defined as a page, and data read and write are performed by each page. In the example shown in FIG. 3, a group of memory cells arranged along a word line constitute two pages. A group of NAND cell units arranged in the direction of the word line is defined as a block BLKi which serves as a unit of data erasure.

In this embodiment, as shown in FIGS. 1 and 2, a certain block is defined as a boot block "BOOTBLK" which serves as a system boot data storage area in the memory cell array 1. Boot data stored in this boot block BOOTBLK will be automatically read out by detecting power-on as described later.

Data I/O buffer 5 is connected to an external I/O terminal to receive write data, output read out data, and receive address and command data. State machine 4 is a controller, which serves for controlling data read, write and erase of the memory cell array 1 in response to external control signals.

Command interface 6 receives external control signals to determine that the input data input to the data I/O buffer 5 is write data, command data or address data, and transfer command data to the state machine 6, address data to the row and column control circuits 21 and 22, and write data to the column control circuit 21.

Read out data of the memory cell array 1 are stored in the page buffer in the column control circuit 21, and output to the external I/O terminal via the I/O buffer 5 in response to a read enable signal. Write data are transferred to the column control circuit 21 and stored therein, and then written by a page under the sequence control of the state machine 4.

Figure 4:
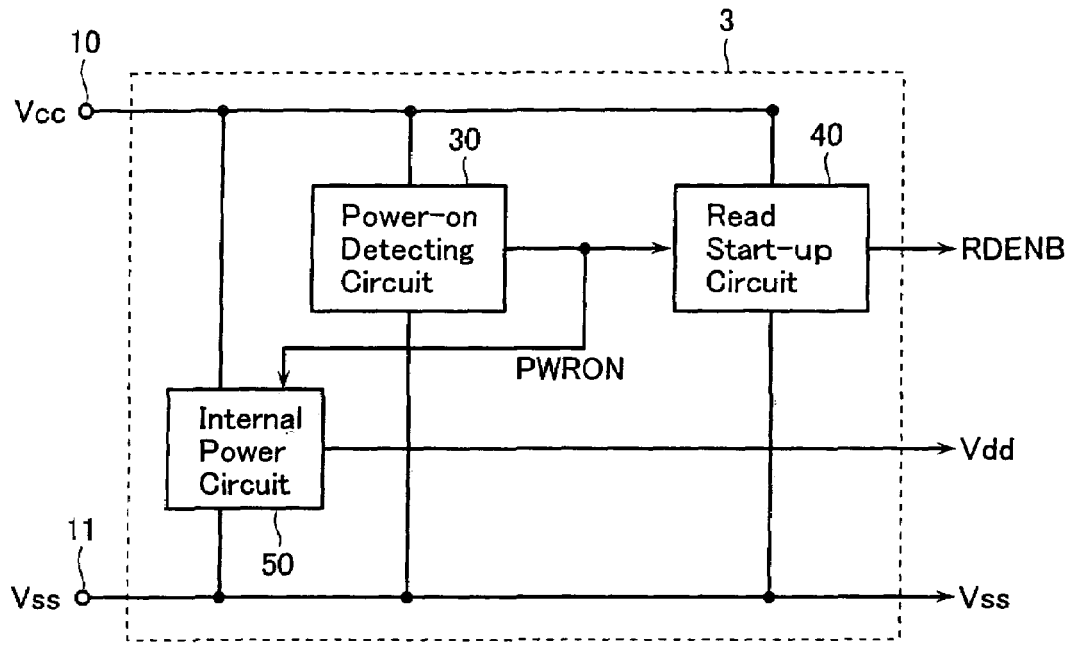
FIG. 4 shows a configuration of a power-on reset circuit of the flash memory.

The power-on reset circuit 3 serves for detecting power-on, outputting an internal power supply voltage Vdd, automatically initializing memory internal circuits, and outputting an internal read enable signal RDENB which is used for automatically read out boot data of the boot block BOOT-BLK set in the memory cell array 1. A detailed configuration of this power-on reset circuit 3 is shown in FIG. 4.

The power-on reset circuit 3 has a first, high-level side, power supply terminal 10 (hereinafter, referred to as Vcc terminal) 10 and a second, low-level side, power supply terminal 11 (hereinafter, referred to as Vss terminal). Vss terminal 11 is usually set at ground potential. Disposed as being connected to the Vcc terminal 10 and Vss terminal 11 are power-on detecting circuit 30, read start-up circuit 40 and internal power supply circuit 50.

The power-on detecting circuit 30 detects rising-up of the external power supply voltage, Vcc, to output a power-on signal PWRON. The internal power supply circuit 50 outputs the internal power supply voltage, Vdd, in response to the external power supply voltage supplied between the Vcc terminal 10 and Vss terminal 11 under the control of the power-on signal PWRON. The read start-up circuit 40 outputs the read enable signal RDENB, which enables automatic read operation of the boot data, in response to the power-on signal PWRON.

Figure 5:
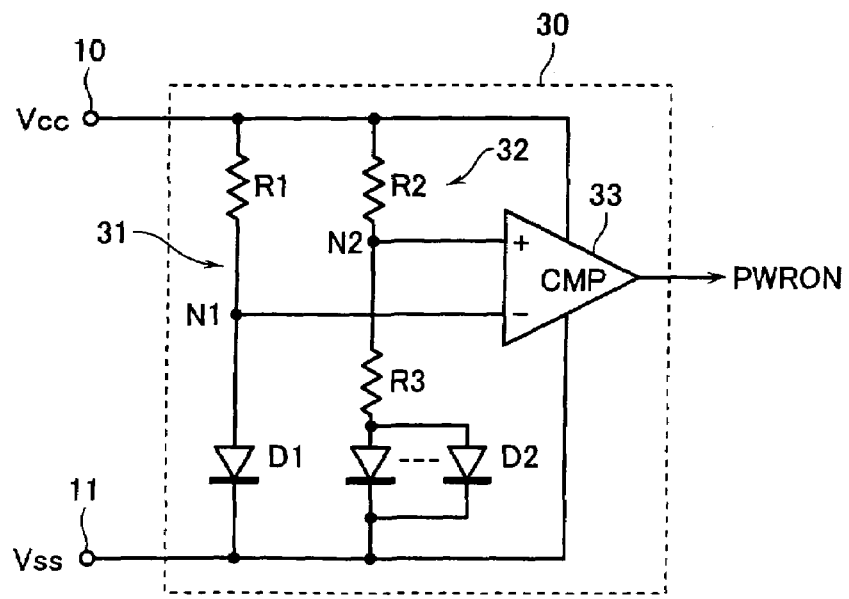
FIG. 5 shows a power-on detecting circuit in the power-on reset circuit.

FIG. 5 shows a basic configuration of the power-on detecting circuit 30. The power-on detecting circuit 30 has two diode circuits 31 and 32 disposed between the Vcc terminal 10 and Vss terminal 11 and a comparator 33 for detecting a voltage difference between voltage detecting nodes N1 and N2 of the diode circuits 31 and 32. The diode circuit 31 has resistor R1 and p-n junction diode D1 connected in series. The cathode of the diode D1 is connected to Vss terminal 11, and the anode to Vcc terminal 10 via the resistor R1. The anode of diode D1 serves as a voltage-detecting node N1. The diode circuit 32 has resistors R2 and R3 and p-n junction diode D2 connected in series. The cathode of the diode D2 is connected to Vss terminal 11, and anode to Vcc terminal 10 via the resistors R2 and R3. The connect node between the resistors R2 and R3 serves as another voltage detecting node N2.

An important matter of this power-on detecting circuit 30 is, first, in a fact that current drivability of the diode D2 is greater than the diode D1. In detail, diode D2 is formed of plural diode units connected in parallel each of which has the same size as the diode D1. Alternatively, the diode D2 may be formed of a device with a cathode area which is a multiple of that of diode D1. Second, the diode circuit 32 has resistor R3 disposed between the voltage detecting node N2 and anode of diode D2, whereby the anode resistance of diode D2 is substantially set as being larger than that of diode D1. The resistors R1 and R2 serve as loads of the diode circuits 31 and 32, thereby having substantially the same resistance value.

In these diode circuits 31 and 32, voltage(V)-current(I) curves intersect at a point while the power supply voltage rises. The comparator 33 has two inputs coupled to the voltage detecting nodes N1 and N2, respectively, whereby output node thereof is inverted in level when the detecting node N2 becomes higher than that of the detecting node N1 in voltage to output a power-on signal PWRON with a "H" level.

Figure 10A:
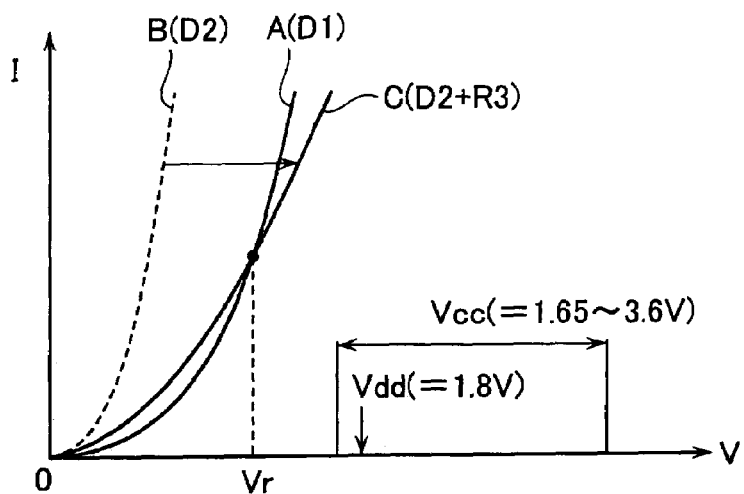
FIG. 10A shows a voltage-current characteristic of a diode circuit in the power-on detecting circuit.

FIG. 10A shows V-I curves of diode circuits 31 and 32 in the power-on detecting circuit 30. Curve A indicates a rising characteristic of forward-biased diode D1 in the first diode circuit 31. The diode D2 has a cathode area larger than that of diode D1. Therefore, if resistor R3 is not disposed, the rising characteristic of diode D2 is expressed by a dotted line curve B which indicates early current rising in comparison with the diode D1. In practice, the resistor R3 being disposed in the diode circuit 32, the rising characteristic thereof becomes as expressed by curve C. The curves A and C intersect at a substantially constant voltage Vr in accordance with the power supply voltage rising. Detecting the crossing voltage Vr by the comparator 33, power-on signal PWRON may be generated.

Figure 10B:
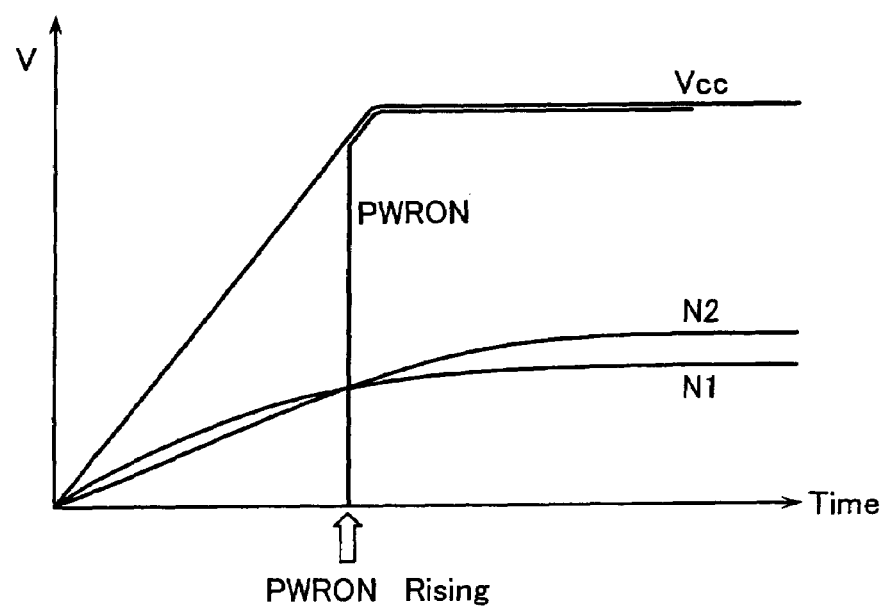
FIG. 10B shows voltage waveforms of the respective nodes in the power-on detecting circuit.

FIG. 10B shows voltage waveforms at the respective nodes of the power-on detecting circuit 30 when the power supply voltage is applied.

As described above, the power-on detecting circuit 30 in accordance with this embodiment detects rising of the external power supply voltage by use of rising characteristics of forward-biased two diodes with different properties. This leads to precise power-on detecting in comparison with the conventional method which detects power-on based on a voltage value obtained by resistance-dividing the power supply voltage. In detail, it becomes possible to output the power-on signal PWRON at an approximately constant voltage with respect to various external power supply voltages Vcc in a range of 1.65V to 3.6V as shown in FIG. 10A. The power-on detecting-circuit 30 is effective in a case that the external power supply voltage Vcc is equal to or higher than the internal power supply voltage Vdd.

Additionally, the power-on detecting circuit 30 shown in FIG. 5 is excellent in a temperature property. Diodes D1 and D2 having substantially the same temperature dependence, the curves A and C shown in FIG. 10A are shifted in the same direction in accordance with temperature change. Therefore, the power-on detecting voltage Vr is held substantially constant without regard to temperature changes.

If the power-on detecting circuit 30 responds too early to an external power supply voltage with an abrupt rising characteristic, it may become troublesome for the internal power supply circuit 50. In detail, the internal power supply circuit 50, as described later, outputs voltage in accordance with the external power supply voltage in an early time after power-on, and then is activated by the power-on signal PWRON to output the internal power supply voltage Vdd. If the power-on signal PWRON is generated just after power-on, the internal power supply voltage can not follow with the external power supply voltage. Therefore, it becomes difficult to generate a stable internal power supply voltage Vdd. In addition, if the output voltage of the internal power supply circuit 50 is not yet stabilized after the read start-up circuit 40 has output the read enable signal RDENB under the control of the power-on signal PWRON, it may cause the memory operation to be erroneous.

Figure 6:
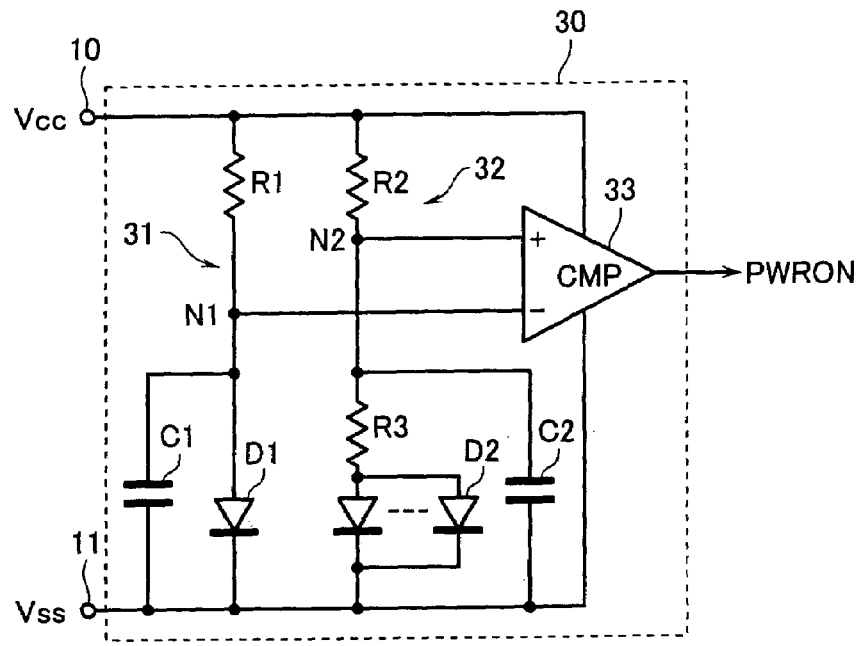
FIG. 6 shows a detailed configuration of the power-on detecting circuit.

In consideration of above-described situations, a more preferable configuration example of the power-on detecting circuit 30 is shown in FIG. 6. In addition to the basic construction shown in FIG. 5, capacitors C1, C2 are disposed between the detecting nodes N1, N2 and Vss terminal, respectively. In other words, CR time constant circuits (i.e., delay circuits) are added to the diode circuits 31 and 32, respectively, so as to delay the voltage rising of detecting nodes N1 and N2. As a result, when an external power supply voltage with an abrupt rising characteristic is supplied, it becomes possible to output the power-on signal PWRON with a delay time.

In detail, without outputting the power-on signal PWRON just after power-on when an external power supply voltage with an abrupt rising characteristic is supplied, it becomes possible to output the power-on signal PWRON after the external power supply voltage has been stabilized. Therefore, the internal power supply circuit 50 may be statically controlled. In other words, for various external power supply voltages with different rising characteristics, there is achieved a situation that whenever the power-on signal PWRON is generated, the internal power supply voltage Vdd has already been stabilized.

Suppose that R1, R2 and R3, and C1 and C2 indicate resistance values and capacitance values, respectively, the CR time constants of the diode circuits 31 and 32 are expressed as $C1 \cdot R1$ and $C2(R2+R3)/R2 \cdot R3$, respectively. Therefore, to make the time constants of the diode circuits 31 and 32 substantially equal, capacitors C1 and C2 is selected to satisfy the relationship of C1<C2.

Figure 7:
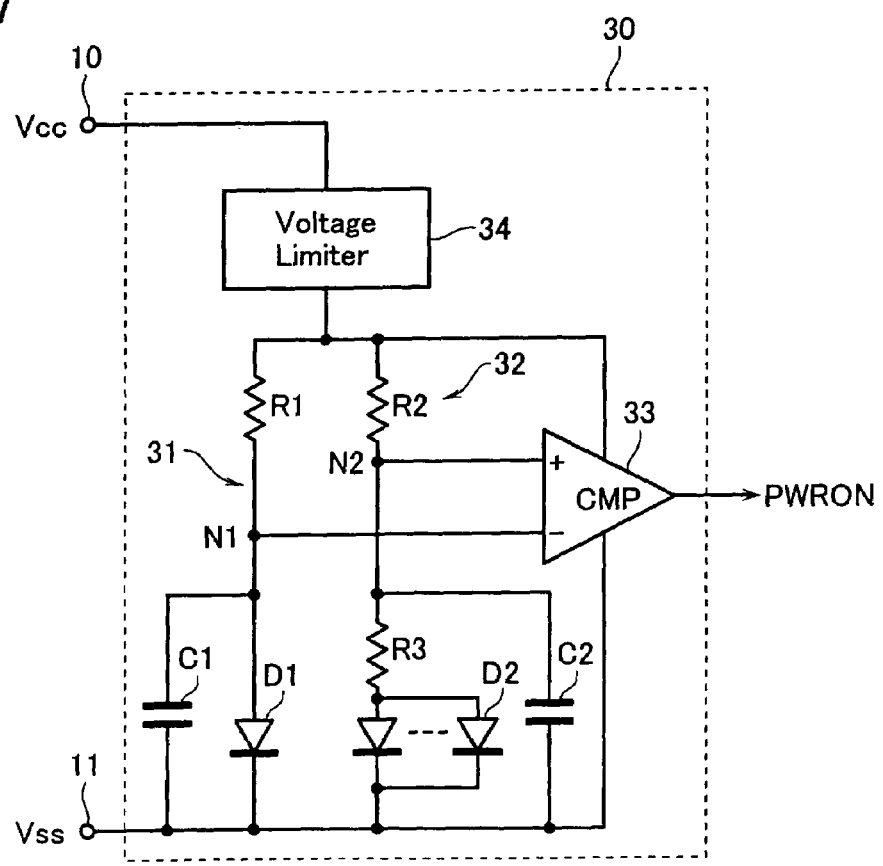
FIG. 7 shows another configuration of the power-on detecting circuit.

FIG. 7 shows another example of the power-on detecting circuit 30, in which a voltage limiter 34 is disposed between the resistors R1, R2 and the Vcc terminal 10. In case the external power supply voltage Vcc is higher than the internal power supply voltage Vdd, adding such the voltage limiter 34, it is possible to make the level of the power-on signal PWRON equal to or near to the internal power supply voltage Vdd.

Figure 8:
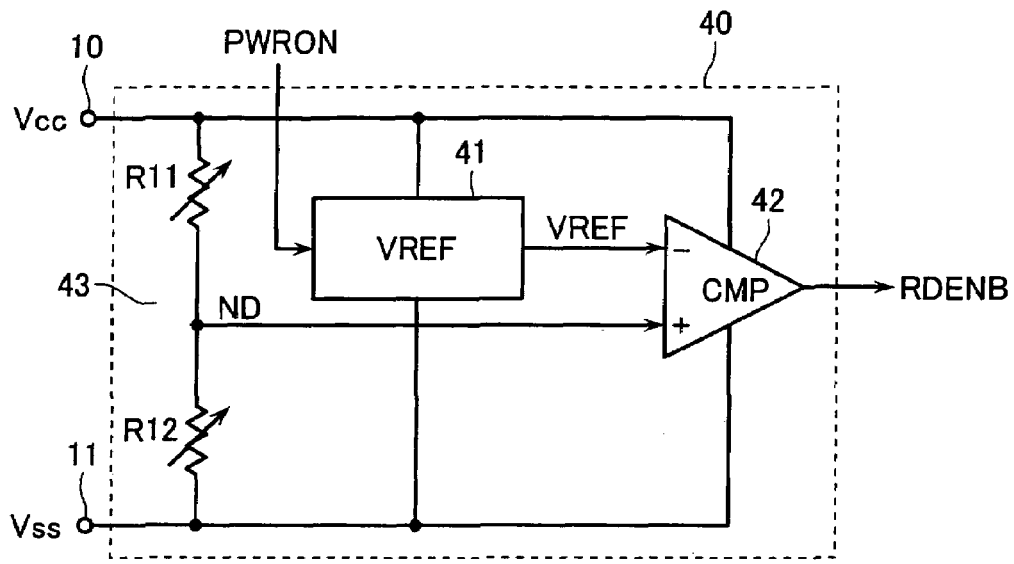
FIG. 8 shows a read start-up circuit in the power-on reset circuit.

FIG. 8 shows a detailed configuration of the read start-up circuit 40 in the power-on reset circuit 3. The read start-up circuit 40 has voltage-dividing circuit 43 for dividing the external power supply voltage supplied between Vcc terminal 10 and Vss terminal 11, reference voltage generating circuit 41 and comparator 42. The voltage-dividing circuit 43 is formed of variable resistors R11 and R12 connected in series between terminals 10 and 11 so as to output a divided voltage at a connect node ND to which resistors R11 and R12 are commonly connected. Although FIG. 8 shows an example that both of resistors R11 and R12 are variable, this is not always required. What is necessary is that at least one of resistors R11 and R12 is variable.

The reference voltage generating circuit 41 is activated by the power-on signal PWRON to output a constant reference voltage VREF independent of the external power supply voltage. A conventional band gap reference (BGR) circuit may be used for this reference voltage generating circuit 41. The comparator 43 compares a voltage output to the node ND with the reference voltage VREF to output the read enable signal RDENB when the voltage at the node ND becomes higher than the reference voltage VREF.

Arranging as described above, the read start-up circuit 40 receives the power-on signal PWRON and detects that the external power supply voltage has reached a certain level so as to output the read enable signal RDENB. By use of variable resistors R11 and R12 in the voltage-dividing circuit 43, it becomes possible to select a suitable external power supply voltage for starting a read operation of the boot block. Explaining in other words, it is possible to set a delay time from the power-on signal PWRON outputting to the read enable signal RDENB outputting at an appropriate value. As a result, it becomes possible to perform the boot data read operation after the internal power supply voltage Vdd has been stabilized.

The read enable signal RDENB is input to the state machine 4, whereby a read operation is started for the boot block BOOTBLK set in the memory cell array 1. That is, boot data are automatically read out in response to power-on without inputting any external control signals to be stored in the page buffer in the column control circuit 21. Inputting an external read enable signal from outside of the chip, the boot data may be output to the external.

Figure 9:
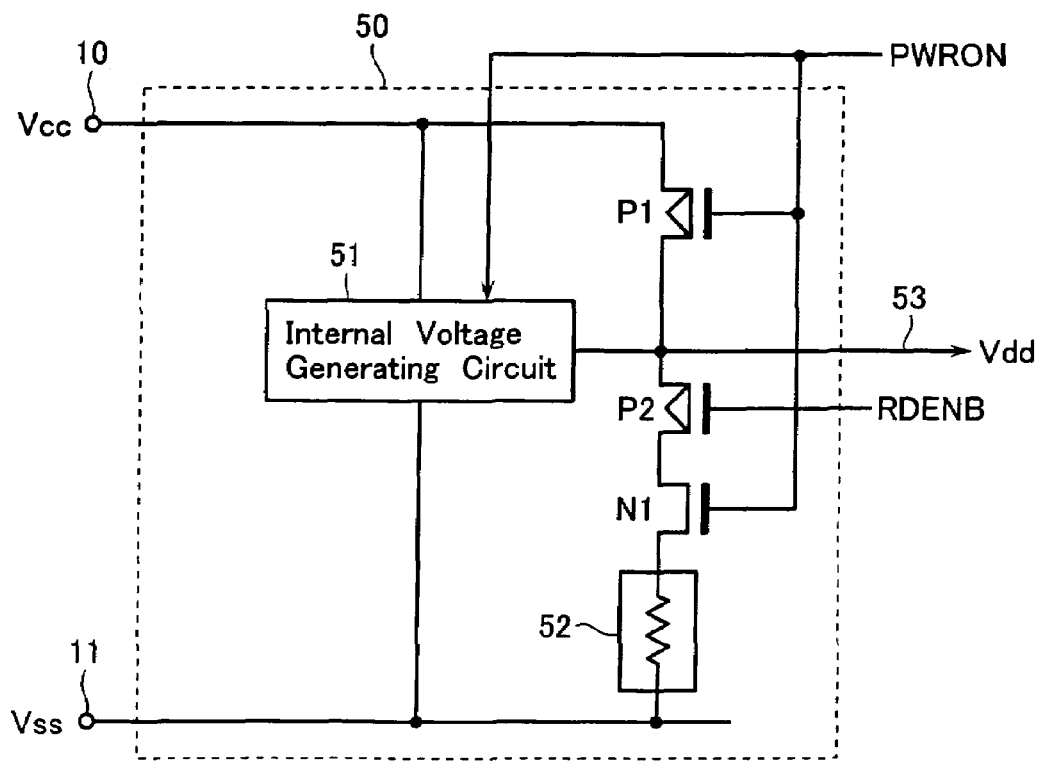
FIG. 9 shows an internal power supply circuit in the power-on reset circuit.

FIG. 9 shows a configuration of the internal power supply circuit 50. This circuit 50 has an internal voltage generating circuit 51 for generating a constant internal power supply voltage Vdd in response to the external power supply voltage Vcc supplied between Vcc terminal 10 and Vss terminal 11. This internal voltage generating circuit 51 is a voltage regulator or a boost circuit activated by the power-on signal PWRON.

Disposed between Vcc terminal 10 and an internal power supply terminal 53 is a PM0S transistor P1 serving as a switch device. This PM0S transistor P1 is held in an on-state until the power-on signal PWRON rises-up, thereby connecting Vcc terminal 10 to the internal power supply terminal 53. That is, the internal voltage generating circuit 51 being inactive in the beginning of power-on before the power-on signal PWRON is generated, the external power supply voltage Vcc is output as it is as the internal power supply voltage Vdd.

Disposed between the internal power supply terminal 53 and Vss terminal 11 are a discharge circuit 52 with a resistor, switching PM0S transistor P2 and switching NM0S transistor N1, which are connected in series. The PM0S transistor P2 is, for example, controlled by the read enable signal RDENB. Therefore, the PM0S transistor P2 is held in an on-state until the signal RDENB rises-up. The NM0S transistor N1 is driven by the power-on signal PWRON so as to prevent the discharge circuit 52 from carrying a through-current while the power-on signal PWRON is "L". With these PM0S transistor P2 and NM0S transistor N1, the discharge circuit 52 is coupled to the internal power supply terminal 53 from the rising time of the power-on signal PWRON to the rising time of the read enable signal RDENB, thereby discharging the internal power supply terminal 53.

Figure 11:
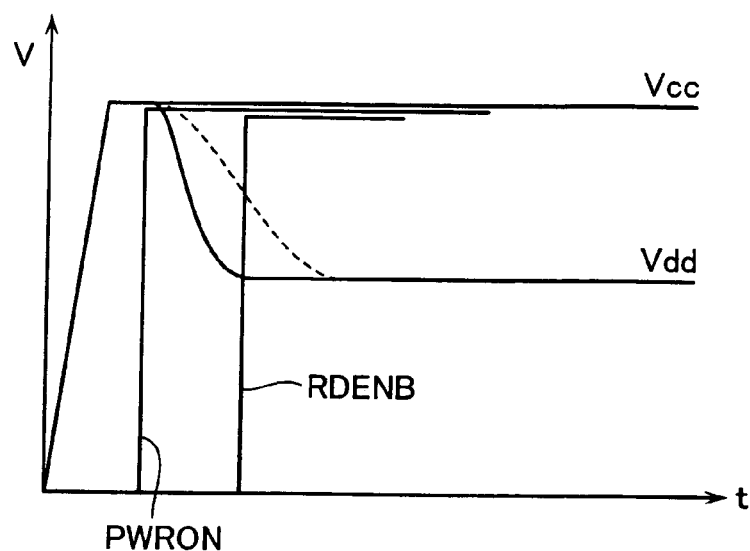
FIG. 11 shows operation waveforms of the internal power supply circuit.

FIG. 11 shows operation voltage waveforms of the internal power supply circuit 50. As described above, the internal power supply circuit 50 is held inactive until the power-on signal PWRON is generated, thereby outputting an internal power supply voltage Vdd which follows to the external power supply voltage Vcc. This assures of the internal power supply voltage outputting within a rising delay time of true internal power supply voltage Vdd which is output after the power-on signal PWRON is generated.

FIG. 11 shows an example in which the internal power supply voltage Vdd is lower than the external power supply voltage Vcc. In this case, the internal voltage generating circuit 51 must step down the voltage at the internal power supply terminal 53 which has been boosted to Vcc. If the discharge path 52 is not prepared, it takes a long time for stepping down the voltage at the internal power supply terminal 53. This may lead to a risk that the internal supply voltage Vdd is not stabilized as shown by a dotted line in FIG. 11 after the read enable signal RDENB is generated. And this causes the boot data read operation and other internal operations performed in response to the read enable signal RDENB to be erroneous.

In this embodiment, letting the discharge path 52 discharge the stored charge at the internal power supply terminal 53, the internal power supply voltage Vdd boosted to Vcc may be rapidly stepped down to be stabilized as shown by a solid line in FIG. 11. In detail, the discharge circuit 53 may be designed in consideration of current drivability of the internal voltage generating circuit 51 as to make the internal power supply voltage Vdd stable until the read enable signal RDENB is generated. Becoming unnecessary after the internal power supply voltage Vdd has been stabilized, the discharge circuit 51 is separated from the node 53. As described above, it is possible to generate the internal power supply voltage Vdd that is stabilized early until the boot block read is started after power-on.

As an embodiment, an electric card using the non-volatile semiconductor memory devices according to the above-described embodiment of the present invention and an electric device using the card will be described bellow.

Figure 12:
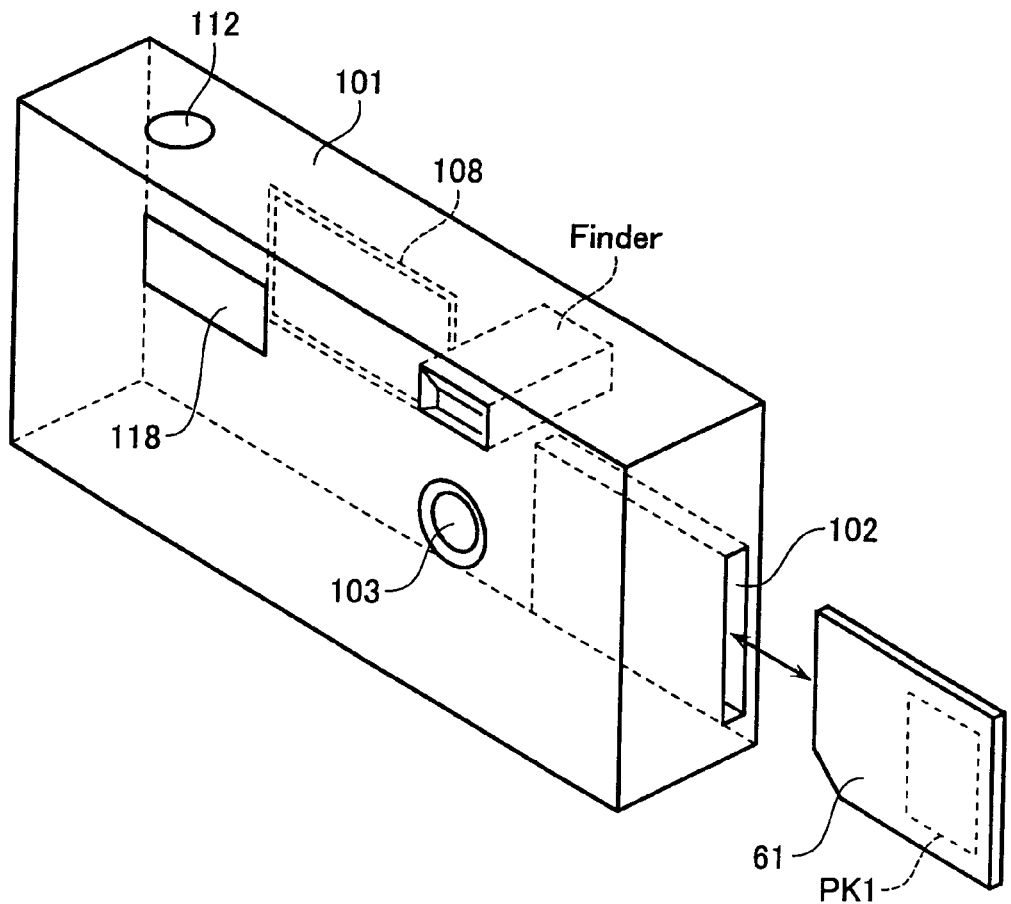
FIG. 12 shows another embodiment applied to a digital still camera.

FIG. 12 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 13:
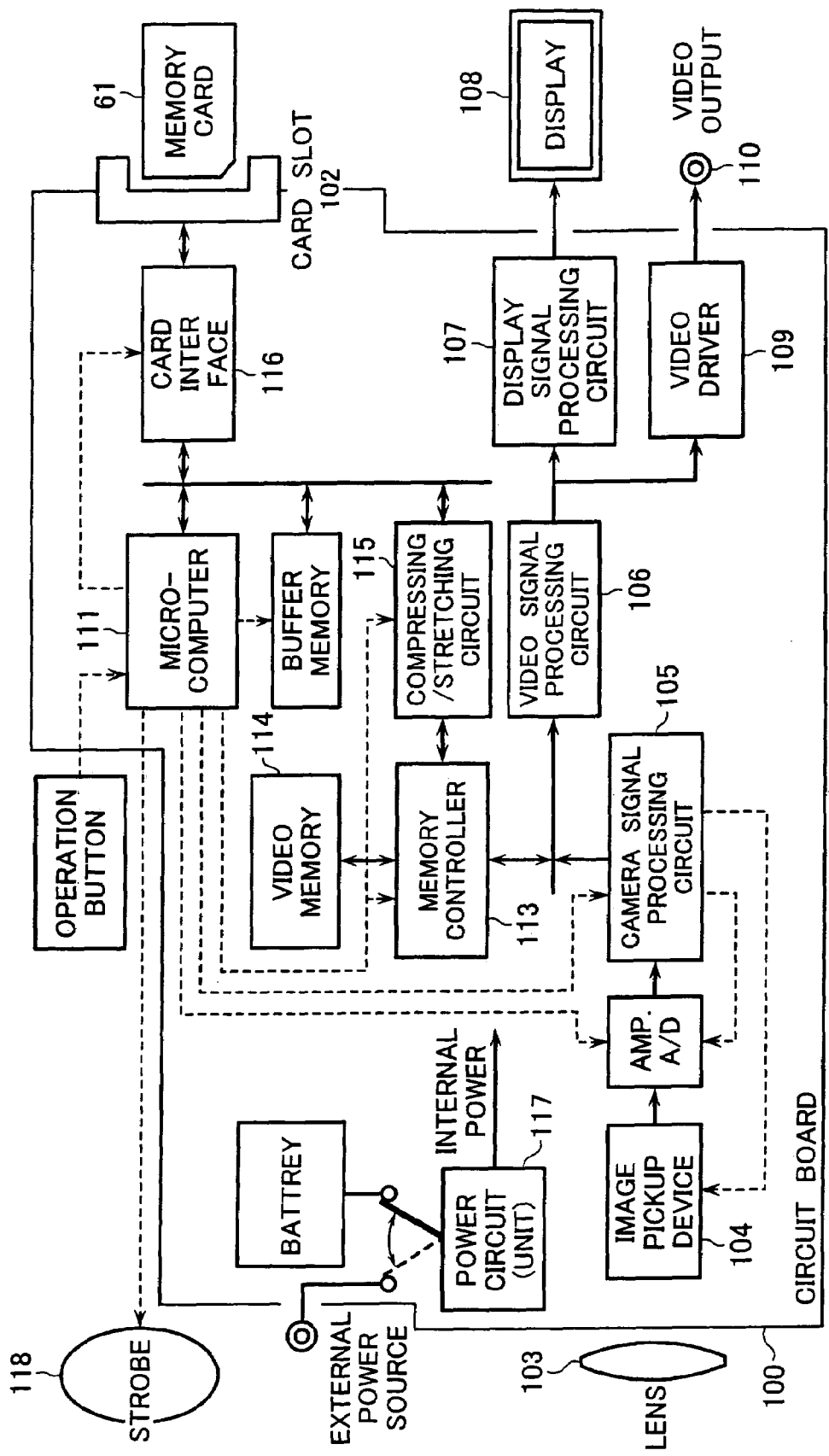
FIG. 13 shows the internal configuration of the digital still camera.
Figure 14A:
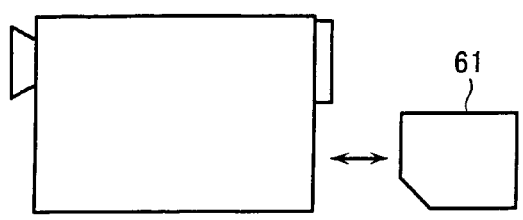
FIGS. 14A to 14J show other electric devices to which the embodiment is applied.
Figure 14F:
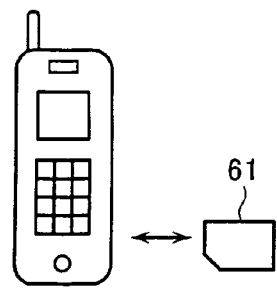
Figure 14B:
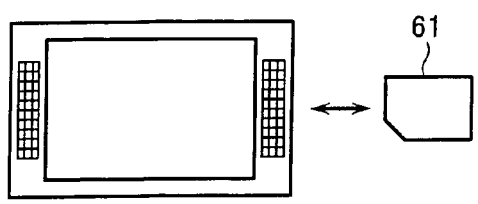
Figure 14G:
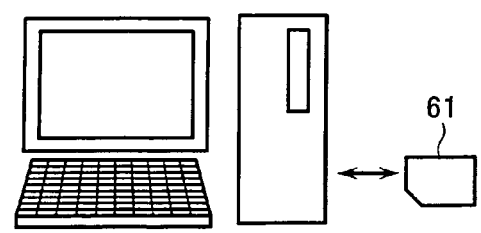
Figure 14C:
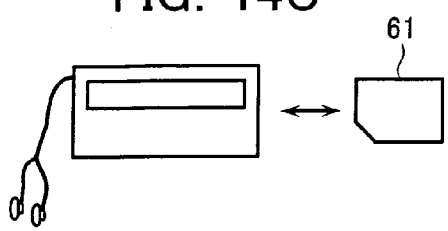
Figure 14H:
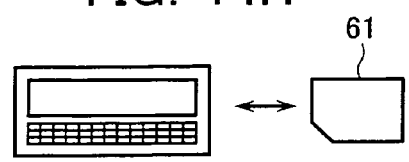
Figure 14D:
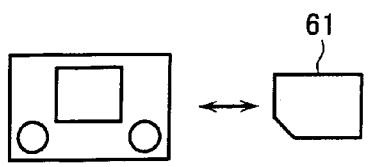
Figure 14I:
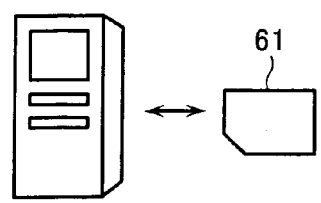
Figure 14E:
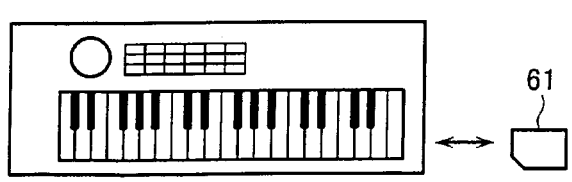
Figure 14J:
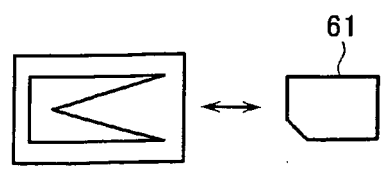

FIG. 13 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 14A to 14J, as well as in portable electric devices. That is, the electric card can also be used in a video camera shown in FIG. 14A, a television set shown in FIG. 14B, an audio apparatus shown in FIG. 14C, a game apparatus shown in FIG. 14D, an electric musical instrument shown in FIG. 14E, a cell phone shown in FIG. 14F, a personal computer shown in FIG. 14G, a personal digital assistant (PDA) shown in FIG. 14H, a voice recorder shown in FIG. 14I, and a PC card shown in FIG. 14J.

This invention is not limited to the above-described embodiments. For example, while it has been explained a NAND-type flash memory, it should be appreciated that the present invention may be applied to other flash memories, other kinds of memory devices, logic LSIs, and so on. Further, it will be understood by those skilled in the art that various changes in form and detail may be made without departing from the spirit, scope, and teaching of the invention.

What is claimed is:

1. A semiconductor integrated circuit device with a power-on detecting circuit, wherein
said power-on detecting circuit comprises:
first and second power supply terminals between which an external power supply voltage is to be supplied;
a first diode circuit having a first diode between said first and second power supply terminals, an anode of said first diode serving as a first voltage detecting node;
a second diode circuit having a resistor and a second diode connected in series between said first and second power supply terminals, said second diode having a current drivability larger than said first diode, a terminal of said resistor opposite to said second diode serving as a second voltage detecting node; and
a first comparator for detecting a voltage of said second voltage detecting node becoming higher than that of said first voltage detecting node to output a power-on signal.

2. The semiconductor integrated device according to claim 1, wherein
said power-on detecting circuit further comprises:
a first capacitor disposed between said first voltage detecting node and said second power supply terminal; and
a second capacitor disposed between said second voltage detecting node and said second power supply terminal.

3. The semiconductor integrated circuit device according to claim 2, wherein
said second diode is formed of a plurality of parallel-connected diode units each having substantially the same size as said first diode; and
said second capacitor has a capacitance larger than that of said first capacitance.

4. The semiconductor integrated circuit device according to claim 1, wherein
said power-on detecting circuit further comprises a voltage limiter disposed between said first and second power supply terminals.

5. The semiconductor integrated circuit device according to claim 1, further comprising:
an internal power supply circuit activated by said power-on signal output from said power-on detecting circuit to output an internal power supply voltage based on an external power supply voltage supplied between said first and second power supply terminals.

6. The semiconductor integrated circuit device according to claim 5, wherein
said internal power supply circuit comprises:
an internal voltage generating circuit for generating said internal power supply voltage to an internal power supply terminal;
a switch element disposed between said first power supply terminal and said internal power supply terminal to be off-driven by said power-on signal; and
a discharging circuit disposed between said internal power supply terminal and said second power supply terminal to discharge the stored charge at said internal power supply terminal in a certain period after having started to supply said external power supply voltage.

7. The semiconductor integrated circuit device according to claim 1, further comprising:
a memory cell array having electrically rewritable and non-volatile memory cells arranged therein;
a read/write circuit for reading and writing said memory cell array; and
a read start-up circuit for activating said read/write circuit to automatically read a boot data storage area set in said memory cell array in response to said power-on signal output of said power-on detecting circuit.

8. The semiconductor integrated circuit device according to claim 7, wherein
said memory cell array comprises NAND cell units arranged therein, each NAND cell unit having plural memory cells connected in series with control gates thereof being connected to different word lines, two ends of each NAND cell unit being connected to a bit line and a source line via select gate transistors, respectively.

9. The semiconductor integrated circuit device according to claim 7, wherein
said read start-up circuit comprises:
a voltage dividing circuit having second and third resistors connected in series between said first and second power supply terminals, at least one of said second and third resistors being variable;
a reference voltage generating circuit activated by said power-on signal output from said power-on detecting circuit to generate a reference voltage based on an external power supply voltage supplied between said first and second power supply terminals, said reference voltage being lower than said external power supply voltage; and
a second comparator for detecting that a divided voltage output from said voltage dividing circuit has become higher than said reference voltage to output a read enable signal.

10. The semiconductor integrated circuit device according to claim 7, further comprising:
an internal power supply circuit activated by said power-on signal output from said power-on detecting circuit to output an internal power supply voltage based on an external power supply voltage supplied between said first and second power supply terminals.

11. The semiconductor integrated circuit device according to claim 10, wherein
said internal power supply circuit comprises:
an internal voltage generating circuit for generating said internal power supply voltage to an internal power supply terminal;
a switch element disposed between said first power supply terminal and said internal power supply terminal to be off-driven by said power-on signal; and
a discharging circuit disposed between said internal power supply terminal and said second power supply terminal to discharge the stored charge at said internal power supply terminal in a certain period after having started to supply said external power supply voltage.

12. A semiconductor integrated circuit device comprising:
a memory cell array having electrically rewritable and non-volatile memory cells arranged therein;
a read/write circuit for reading and writing said memory cell array;
a state machine for controlling of read, write and erase operations of said memory cell array; and
a power-on reset circuit for initializing internal circuits, said power-on reset circuit including a power-on detecting circuit for detecting that an external power supply voltage is supplied to output a power-on signal, wherein
said power-on detecting circuit comprises:
first and second power supply terminals between which the external power supply voltage is to be supplied;
a first diode circuit having a first diode between said first and second power supply terminals, an anode of said first diode serving as a first voltage detecting node;
a second diode circuit having a resistor and a second diode connected in series between said first and second power supply terminals, said second diode having a current drivability larger than said first diode, a terminal of said resistor opposite to said second diode serving as a second voltage detecting node; and
a first comparator for detecting a voltage of said second voltage detecting node becoming higher than that of said first voltage detecting node to output a power-on signal.

13. The semiconductor integrated circuit device according to claim 12, wherein
said power-on detecting circuit further comprises:
a first capacitor disposed between said first voltage detecting node and said second power supply terminal; and
a second capacitor disposed between said second voltage detecting node and said second power supply terminal.

14. The semiconductor integrated circuit device according to claim 13, wherein
said second diode is formed of a plurality of parallel-connected diode units each having substantially the same size as said first diode; and
said second capacitor has a capacitance larger than that of said first capacitance.

15. The semiconductor integrated circuit device according to claim 12, wherein
said power-on detecting circuit further comprises a voltage limiter disposed between said first and second power supply terminals.

16. The semiconductor integrated circuit device according to claim 12, wherein said power-on reset circuit further comprises:
an internal power supply circuit activated by said power-on signal output from said power-on detecting circuit to output an internal power supply voltage based on an external power supply voltage supplied between said first and second power supply terminals; and
a read start-up circuit for activating said read/write circuit to automatically read a boot data storage area set in said memory cell array in response to said power-on signal output of said power-on detecting circuit.

17. The semiconductor integrated circuit device according to claim 16, wherein
said internal power supply circuit comprises:
an internal voltage generating circuit for generating said internal power supply voltage to an internal power supply terminal;
a switch element disposed between said first power supply terminal and said internal power supply terminal to be off-driven by said power-on signal; and
a discharging circuit disposed between said internal power supply terminal and said second power supply terminal to discharge the stored charge at said internal power supply terminal in a certain period after having started to supply said external power supply voltage.

18. The semiconductor integrated circuit device according to claim 16, wherein
said read start-up circuit comprises:
a voltage dividing circuit having second and third resistors connected in series between said first and second power supply terminals, at least one of said second and third resistors being variable;
a reference voltage generating circuit activated by said power-on signal output from said power-on detecting circuit to generate a reference voltage based on an external power supply voltage supplied between said first and second power supply terminals, said reference voltage being lower than said external power supply voltage; and
a second comparator for detecting that a divided voltage output from said voltage dividing circuit has become higher than said reference voltage to output a read enable signal.

19. The semiconductor integrated circuit device according to claim 12, wherein
said memory cell array comprises NAND cell units arranged therein, each NAND cell unit having plural memory cells connected in series with control gates thereof being connected to different word lines, two ends of each NAND cell unit being connected to a bit line and a source line via select gate transistors, respectively.

20. A method of detecting that an external power supply voltage is higher than a predetermined level, comprising:
supplying an external power supply voltage between first and second power supply terminals;
disposing a first diode circuit having a first diode between said first and second power supply terminals, an anode of said first diode serving as a first voltage detecting node;
disposing a second diode circuit having a resistor and a second diode connected in series between said first and second power supply terminals, said second diode having a current drivability larger than said first diode, a terminal of said resistor opposite to said second diode serving as a second voltage detecting node; and
comparing a voltage of said second voltage detecting node with that of said first voltage detecting node to output a power-on signal.

* * * * *